(12) United States Patent
Chowdhary et al.

(10) Patent No.: US 9,832,008 B2
(45) Date of Patent: Nov. 28, 2017

(54) OVERSAMPLING CDR WHICH COMPENSATES FREQUENCY DIFFERENCE WITHOUT ELASTICITY BUFFER

(71) Applicant: STMicroelectronics International N.V., Amsterdam (NL)

(72) Inventors: Abhishek Chowdhary, Delhi (IN); Vivek Uppal, Delhi (IN); Alok Kaushik, Delhi (IN); Sajal Kumar Mandal, West Bengal (IN); Tapas Nandy, Delhi (IN); Sanjeev Chopra, Jalandhar (IN)

(73) Assignee: STMicroelectronics International N.V., Amsterdam (NL)

(*) Notice: Subject to any disclaimer, the term of this patent is extended or adjusted under 35 U.S.C. 154(b) by 0 days.

(21) Appl. No.: 14/986,152

(22) Filed: Dec. 31, 2015

(65) Prior Publication Data
US 2016/0119117 A1    Apr. 28, 2016

Related U.S. Application Data

(62) Division of application No. 14/231,499, filed on Mar. 31, 2014, now Pat. No. 9,356,770.

(51) Int. Cl.
*H04L 7/00*  (2006.01)
*H04L 7/08*  (2006.01)
(Continued)

(52) U.S. Cl.
CPC .......... *H04L 7/0087* (2013.01); *H03L 7/0807* (2013.01); *H04L 7/033* (2013.01);
(Continued)

(58) Field of Classification Search
CPC . H03L 7/0807; H03L 7/091; H04L 25/03057; H04L 43/022
See application file for complete search history.

(56) References Cited

U.S. PATENT DOCUMENTS 5,986,485 A * 11/1999 O'Sullivan ............. H03L 7/095
327/156
6,545,507 B1    4/2003 Goller
(Continued)

OTHER PUBLICATIONS

Yang, Chih-Kong Ken et al., "A 0.8-µm CMOS 2.5 Gb/s Oversampling Receiver and Transmitter for Serial Links," IEEE Journal of Solid-State Circuits, vol. 31, No. 12, Dec. 1996; pp. 2015-2023.
(Continued)

*Primary Examiner* — Ross Varndell
(74) *Attorney, Agent, or Firm* — Seed Intellectual Property Law Group LLP

(57) ABSTRACT

A method, algorithm, architecture, circuit and/or system that compensates for frequency difference in oversampled CDRs. The oversampled CDR uses a programmable divider whose division ratio is changed, for one or more cycles, from its usual division ratio, when accumulated phase movement in either direction exceeds a threshold. Accordingly, the elasticity buffer in oversampled CDRs can be made much smaller or entirely eliminated, resulting in less area, and reduced or eliminated dependence of max allowed burst size on ppm difference. The threshold can be kept programmable, and more than half unit interval, to provide robustness towards high frequency jitter.

14 Claims, 9 Drawing Sheets

(51) Int. Cl.
    *H04L 7/033*     (2006.01)
    *H03L 7/08*     (2006.01)
    *H04L 12/26*     (2006.01)
    *H04L 25/03*     (2006.01)
    *H03L 7/091*     (2006.01)

(52) U.S. Cl.
    CPC .......... *H04L 7/0331* (2013.01); *H04L 7/0338* (2013.01); *H04L 43/022* (2013.01); *H03L 7/091* (2013.01); *H04L 7/0004* (2013.01); *H04L 7/005* (2013.01); *H04L 25/03057* (2013.01)

(56) References Cited

U.S. PATENT DOCUMENTS

| | | |
|---|---|---|
| 2002/0146084 A1 | 10/2002 | Cranford, Jr. et al. |
| 2005/0180536 A1 | 8/2005 | Payne et al. |
| 2006/0045224 A1 | 3/2006 | Cranford, Jr. et al. |
| 2010/0091925 A1* | 4/2010 | Nedovic ............... H03L 7/0891 375/359 |
| 2012/0139593 A1 | 6/2012 | Saito |
| 2012/0170621 A1 | 7/2012 | Tracy et al. |

OTHER PUBLICATIONS

Hsieh, Ming-ta et al., "Architectures for Multi-Gigabit Wire-Linked Clock and Data Recovery," IEEE Circuits and Systems Magazine, Fourth Quarter 2008; pp. 45-57.

Park, Sang-Hune et al., "A Single-Data-Bit Blind Oversampling Data-Recovery Circuit with an Add-Drop FIFO for USB2.0 High Speed Interface," IEEE Transactions on Circuits and Systems-II: Express Briefs, vol. 55, No. 2, Feb. 2008; pp. 156-160.

Redman-White, William et al., "A Robust High Speed Serial PHY Architecture With Feed-Forward Correction Clock and Data Recovery," IEEE Journal of Solid-State Circuits, vol. 44, No. 7, Jul. 2009; pp. 1914-1926.

* cited by examiner

OVERSAMPLING CDR WHICH COMPENSATES FREQUENCY DIFFERENCE WITHOUT ELASTICITY BUFFER

BACKGROUND

Technical Field

The present disclosure relates to the field of clock and data recovery circuits. The present disclosure relates more particularly to the field of oversampling clock and data recovery circuits.

Description of the Related Art

In embedded clock serial link receivers, data and clock have to be recovered from the incoming NRZ bit stream without the aid of any additional clock input from the transmitter side. The challenge is to recover the data bits in the presence of jitter, keeping the rate of errors within a target bit error rate (BER) limit, and to provide a clock output to the next higher communication layer on the receiver side that follows the transmitter frequency deviations.

Clock and data recovery circuits (CDR) are used for this purpose. The performance figures of merit of any CDR are its lock time, jitter tolerance at targeted BER, and tolerable frequency difference between TX and RX.

One class of CDR circuits is based on oversampling the incoming bit stream and processing the samples with algorithms (e.g., phase picking/tallying) to determine the sample most likely to represent the data sent by the transmitter. In an oversampling CDR, a phase locked loop generates multiple phases of a bit rate clock for taking multiple samples of each incoming bit. These samples are collected and resynchronized to a divided version of the bit rate clock and then processed according to an algorithm to choose the most appropriate sample as the recovered data. The recovered data and the divided clock are the outputs of the CDR. However, the frequency of the clock on the receiver side may not exactly mirror the deviations in the frequency of the transmitter clock. To alleviate this problem an appropriately sized first in first out (FIFO) elasticity buffer is included inside the CDR to absorb the frequency difference between TX and RX over the maximum burst length targeted by the serial link protocol. The larger the FIFO, the larger the max burst size can be. However, as the FIFO becomes large, the chip area consumed by the FIFO increases and hence the area of CDR also increases.

BRIEF SUMMARY

One embodiment is an oversampling clock and data recovery circuit CDR that changes a frequency divider ratio when the receiver clock phase has drifted more than a threshold amount with respect to an input data phase, due to frequency difference between the receiver clock and the transmitter clock. In this way, rather than having a large buffer to store excess bits, the division ratio is dynamically adjusted to remove the need for a large FIFO.

In one embodiment, the CDR includes a sampling circuit that samples the input data signal with respect to a plurality of clock signals generated from the receiver clock and being mutually out of phase with each other. One of the samples is selected as the center sample.

In one embodiment, the CDR includes a unit interval (UI) movement controller coupled to a phase tracker.

The phase tracker outputs current center phase information to the UI movement controller. If the current center position is different from the starting center position by more than a high threshold value, then the UI movement controller outputs a signal to the frequency divider causing the frequency divider to decrease the frequency for one or more clock cycles in order to shift the center position back to the center of the current data bit. If the current center position is different from the starting center position by more than a low threshold value, then the UI movement controller outputs a signal to the frequency divider causing the frequency divider to increase the frequency for one or more clock cycles in order to shift the center position back to the center of the current data bit.

DETAILED DESCRIPTION

Figure 1:
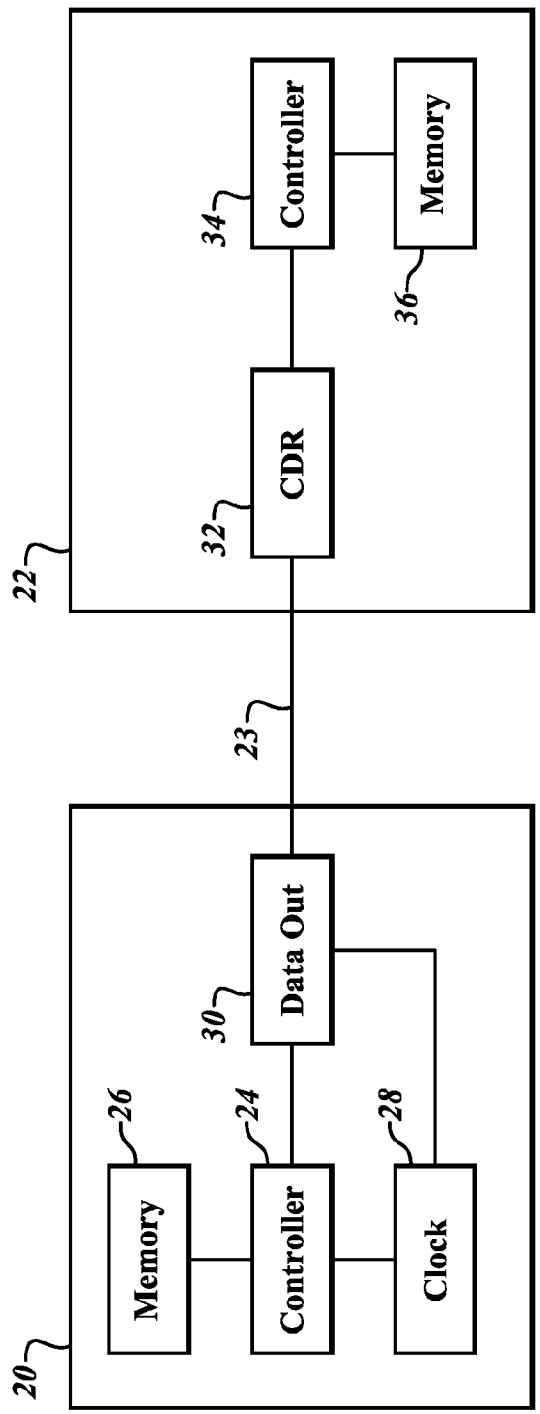
FIG. 1A is a block diagram of two electronic devices connected by a data transfer link according to one embodiment.
FIG. 1B is a timing diagram of a clock signal and a data signal according to one embodiment.

FIG. 1A is a block diagram of a first electronic device 20 and a second electronic device 22 linked by a data transmission line 23 according to one embodiment. The first electronic device 20 includes a controller 24, a memory 26, a clock 28, and a data output circuit 30, each coupled to the controller 24. The second electronic device 22 includes a clock and data recovery circuit 32, a controller 34 coupled to the clock and data recovery circuit 32, and a memory 36 coupled to the controller 34. The data transmission link 23 couples the data output circuit 30 to the clock and data recovery circuit 32.

It is common for a person to transfer data from a first electronic device 20 to a second electronic device 22. Typically this involves copying data from the memory 26 of the first electronic device 20 to the memory 36 of the second electronic device 22. In order to transfer the data, the controller 24 reads data out of the memory 26 and outputs it to the data output circuit 30. The data output circuit 30 transmits the data on the data transmission link 23. The transitions between high and low states in the data signal transmitted on the transmission link 23, which represent the data being transferred, are timed in phase with the clock signal generated by the clock 28. However, the clock signal itself is not transmitted on the data transmission link 23. This makes it difficult for the receiving device 22 to accurately extract the data from the data signal.

In order to accurately extract the data from the data signal, the second electronic device 22 includes a clock and data recovery circuit 32. The clock and data recovery circuit 32 extracts the data from the data signal by generating a clock signal corresponding to the clock 28 based on transitions in the data signal. The clock and data recovery circuit recovers the clock signal and is then able to extract the data and output it to the controller 34. The controller 34 can store the data in the memory 36 or process it in some other manner.

FIG. 1B is a timing diagram which illustrates the clock signal generated by the clock 28 and the data signal output from the data output circuit 30 on the data transmission link 23. As can be seen, the clock signal is a periodic signal that switches between high and low states with a fixed frequency. The data signal includes transitions between high and low states which represent the data being transferred. The transitions in the data signal occur on the leading and falling edges of the clock signal. In this way the transitions in the data signal are synchronized with the clock signal generated by the clock 28.

Figure 2:
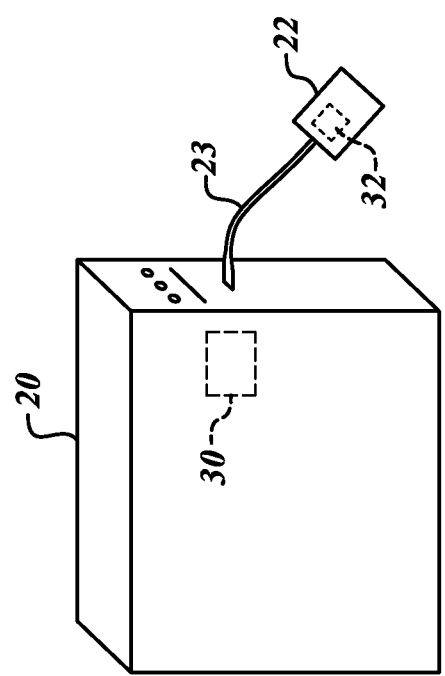
FIG. 2 is an illustration of two electronic devices according to one embodiment.

FIG. 2 is an illustration of the first electronic device 20 and the second electronic device 22 coupled together by a data transmission line 23 according to one embodiment. In the embodiment illustrated in FIG. 2, the electronic device 20 is a common desktop computer tower commonly used by people in their homes and places of business. The second electronic device 22 is an external solid-state memory drive. The first electronic device 20 includes a data output circuit 30 which outputs data from a magnetic hard drive. The data output circuit 30 is shown in dashed lines. As described previously, the data output circuit 30 is coupled to a clock 28, memory 26, and controller 24, though these are not shown in FIG. 2. The solid-state drive 22 includes a clock and data recovery circuit 32 for recovering the clock and data signals transmitted by the output circuit 30 as described previously. The desktop computer 20 and the solid-state drive 22 are coupled together by a data transmission link 23 which is a data transmission link by which data is transferred from the desktop computer 22 to the solid-state drive 22.

Figure 3:
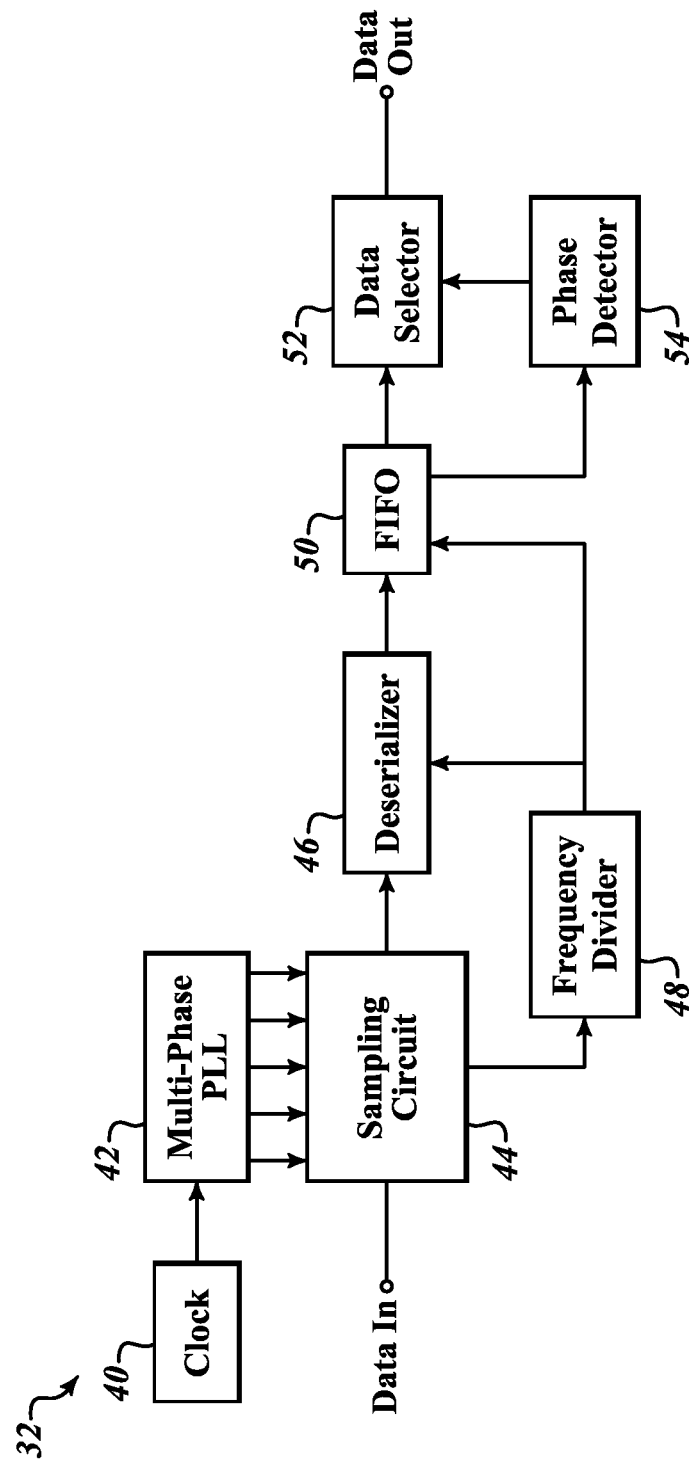
FIG. 3 is a block diagram of a known clock and data recovery circuit according to one embodiment.

FIG. 3 is a block diagram of a known CDR 32. The CDR 32 includes a clock 40 coupled to a multiphase phase locked loop (PLL) 42. The phase locked loop 42 is coupled to a sampling circuit 44. The sampling circuit 44 is coupled to the data input Data In that receives data from the transmitting device 20. A deserializer 46 is coupled to an output of the sampling circuit 44. A frequency divider 48 is also coupled to an output of the sampling circuit 44. The deserializer 46 and the frequency divider 48 are coupled to a first in first out elasticity buffer (FIFO) 50. A data selector 52 is coupled to the output of the FIFO 50. A phase detector 54 is coupled to the output of the FIFO 50 and to the data selector 52. The output of the data selector 52 is the data output of the CDR 32.

The PLL 42 receives the clock signal from the clock 40 and creates multiple clock signals mutually out of phase with each other and feeds them to the sampling circuit 44. The number of phases depends on the oversampling ratio (OSR) of the CDR 32. The data arriving at the data input is sampled by the sampling circuit 44 in conjunction with the multiple clock signals output by the PLL 42. The sampling circuit generates a plurality of samples of each bit.

The frequency divider 48 receives one of the clock phase signals from the sampling circuit 44 and divides it by a division ratio N. The value of N corresponds to the number of bits whose samples are processed together for deciding the next center.

The deserializer 46 receives the divided clock signal from the frequency divider 48. The deserializer 46 also receives the samples from the sampling circuit 44. The deserializer 46 aligns the samples of N bits with the divide by N clock signal output of the frequency divider 48 and provides them to the FIFO 50.

The FIFO 50 receives the samples from the deserializer 46 and stores them before the data bits are recovered. The FIFO 50 has sufficiently large storage locations (i.e., memory) that it can prevent data underflow or overflow when there is a difference in the frequencies of the transmitter and receiver clocks.

The phase detector 54 receives the samples from the FIFO 50 and processes them using an algorithm to determine center phase for the current set of N data bits. The phase detector 54 may use either feedforward or feedback algorithms in determining the next center phase signal. The feedforward algorithms compute a new center irrespective of the previous center. The feedback algorithms compute the new center taking into consideration the previous center.

The data selector 52 receives an output signal from the phase detector 54 indicating the new center position. The data selector 52 is coupled to the output of the FIFO 50 and selects data bits from the FIFO 50 based on the output of the phase detector 54. The data selector 52 then provides the N data bits to the data output. These bits represent the recovered data transmitted from the transmitter.

In an example in which the transmitter clock has a different frequency than the receiver clock 40, the center sample decided by the phase detector 54 will constantly move in one direction, thereby entering either future or past bits, for sufficiently long data bursts. The FIFO 50 acts as a buffer that stores the samples of a large number of data bits on either side of N current bits. The number of data bits whose samples is to be kept in the FIFO depends on the max frequency difference allowed between transmitter clock and receiver clock and max burst size allowed. In other words, in the known CDR circuit 32 of FIG. 3, a large FIFO 50 is introduced in order to alleviate the problem of mismatch between the transceiver and receiver clock frequencies.

Inclusion of the large FIFO 50 poses constraints on circuitry in the downline of the CDR 32. In particular the size of FIFO 50 constrains the maximum burst size when there are differences in frequency between the transmitter clock and the receiver clock 40. Additionally, the presence of a large FIFO 50 consumes extra area in the integrated circuit device in which the CDR 32 is formed. This leads to increased cost of manufacturing the CDR 32 of FIG. 3.

Figure 4:
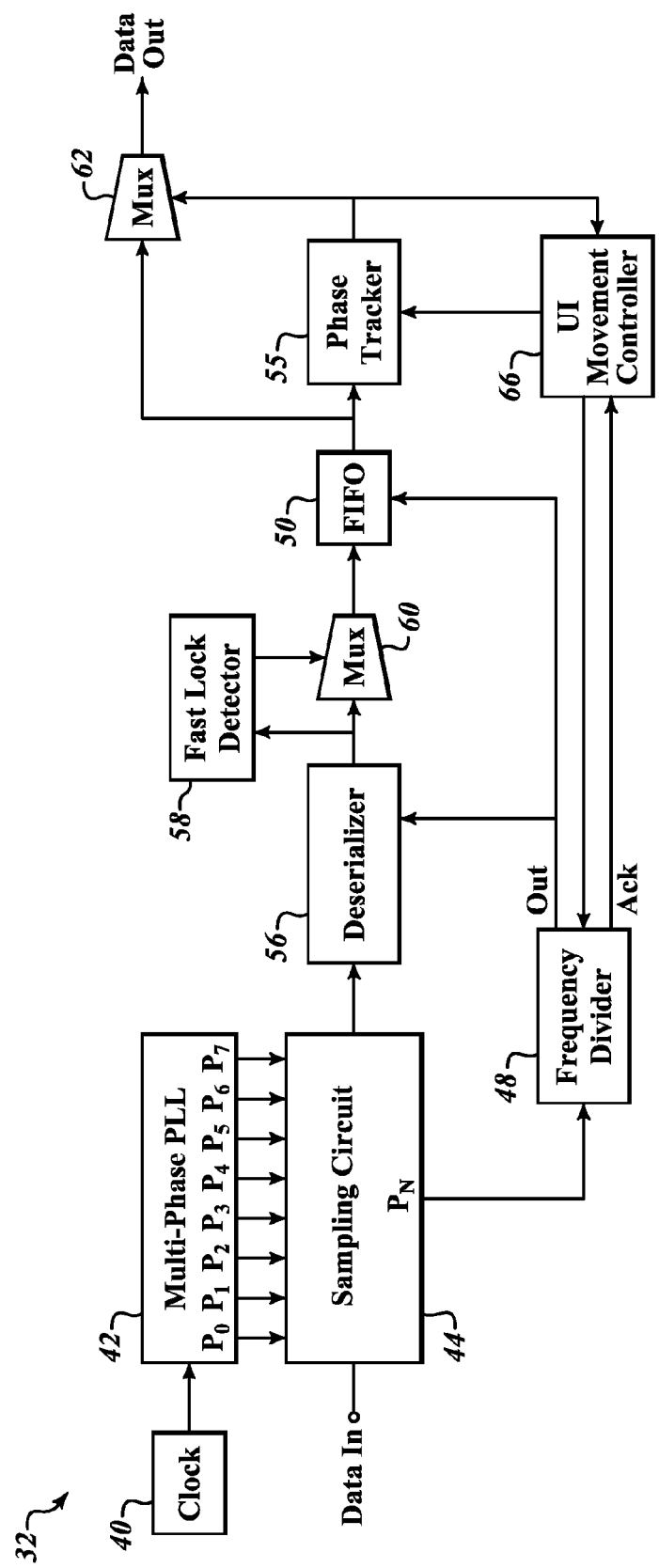
FIG. 4 is a block diagram of a clock and data recovery circuit according to one embodiment.

FIG. 4 is a block diagram of a CDR circuit 32 according to one embodiment. The CDR circuit 32 of FIG. 4 includes a receiver clock 40 that outputs a clock signal to a multiphase PLL 42 as described previously in relation to FIG. 3. The multi-phase PLL 42 receives the clock signal from the clock 40 and outputs to the sampling circuit 44 multiple clock signals mutually out of phase with each other. In the example of FIG. 4, the oversampling ratio (OSR) is taken as 8, hence the PLL 42 outputs eight clock signals each out of phase with each other as described in more detail with respect to FIG. 5.

The sampling circuit 44 samples the data received at Data In with an oversampling factor of eight, corresponding to the eight phase signals output by the PLL 42. The sampling circuit passes one of the clock signals to the frequency divider 48 which produces an output that is a division by N of the receiver clock 40 under normal conditions. The sampling circuit 44 passes the samples to the deserializer 56 which collects the samples of N bits and aligns them to the divide by N clock produced by the frequency divider 48. The deserializer 56 outputs the samples to the fast lock detector block 58 which decides the starting center sample position based on detection of a known pattern. Other algorithms may be used for detection of the initial center sample position inside the fast lock detector block 58. The fast lock detector block 58 controls the multiplexer 60 which realigns the sample outputs of the deserializer 56 such that starting center position becomes a pre-decided known value in the realigned samples at the output of mux 60. In the example of FIG. 4, with an OSR of 8, the pre-decided known starting center is 3. The realignment is needed for circuit simplification explained as follows. After the initial phase lock by the Fast lock detector block 58, the center phase of the input data bit can correspond to any of the eight phase positions. For every center choice A, the corresponding bit boundaries will be A+4 and A−3. To simplify the circuit, the value of A is fixed. This is done by a suitable remapping of samples through multiplexer 60 to ensure that the starting center phase will always be A=3. So the bit boundaries are A=0 and A=7.

The multiplexer 60 outputs the realigned samples to the FIFO 50. The FIFO 50 outputs the samples to the phase tracker 54.

The phase tracker 55 decides current center sample position applicable for N bits being processed and outputs a signal to a unit interval (UI) movement controller 66 and a data selector multiplexer 62, indicating the position of the selected center sample. Data selector mux 62 outputs N recovered data bits from the samples in FIFO 50 based on current center phase from Phase tracker 55. The size of FIFO 50 is such as to store samples of N current bits and only M past and M future bits where M can be as low as 1 and M is less than N−1.

The UI movement controller 66 includes logic that receives the output signal from the phase tracker 55 and outputs a command to the frequency divider 48 to adjust the division ratio N. The UI movement controller 66 issues a command to adjust the division ratio when the center phase has moved by a phase difference threshold $P_{TH}$ with respect to the starting center phase after lock. When the frequency divider 48 receives the command to adjust the division ratio, the division ratio is adjusted by P (i.e., division ratio becomes N−P or N+P) for Q cycles and an acknowledgment is sent back to the UI movement controller 66 to validate the cycles in which the division ratio has been changed from the base value. The choice of P and Q has to be such as to satisfy the relation P*Q=M. In these Q acknowledgment cycles, the number of new data bits whose samples are collected by the deserializer 56 will be either N+P or N−P, i.e., either more or less by the same amount by which the division ratio is changed. This allows the center sample movement to be reset as explained by example below. $P_{TH}$ is chosen between (M−1)*OSR+OSR/2 and (M−1)*OSR+OSR.

In the examples below, OSR=8, N=10, M=1, $P_{TH}$=6, P=1 and Q=1, i.e., FIFO 50 stores samples of one extra bit on either side of 10 current bits, and the frequency divider 48 changes its division ratio from the base value of N=10 to either N=9 or N=11 for one cycle only when requested by the UI movement controller upon drift of center phase in either direction by 6 positions.

Figure 5:
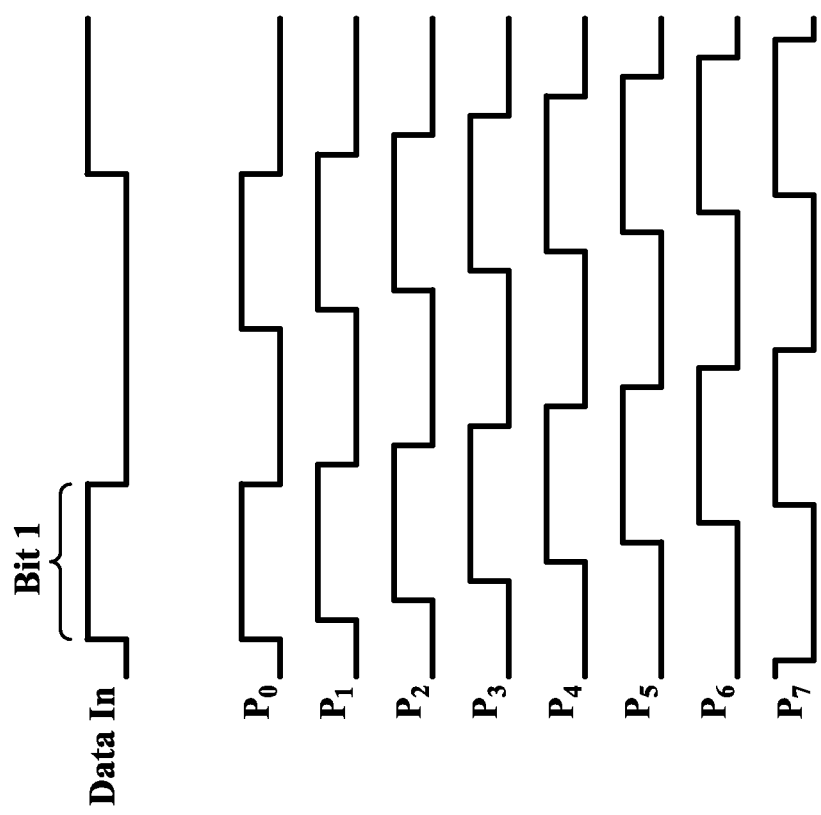
FIG. 5 is a timing diagram of an input data signal and clock signals having different phases according to one embodiment.

FIG. 5 illustrates an incoming data bit received at Data In. Bit 1 was generated by the transmission circuit in accordance with the clock frequency of the transmission clock. The phase signals P0-P7 are clock signals generated by the PLL 42 based on the clock signal generated by the receiver clock 40. The signals P0-P7 all have the same frequency but are out of phase with respect to each other. The signal P1 is ⅛ of a cycle out of phase with respect to P0. The signal P2 is further out of phase by ⅛ of a cycle with respect to P1. The signal P3 is out of phase by ⅛ of the cycle with respect to P2. The signal P4 is out of phase by ⅛ of a cycle with respect to P3, and so on. The samples are generated by the sampling circuit 44 by sampling input data signal with each phase signal. One of the samples is selected as the center.

Figure 6:
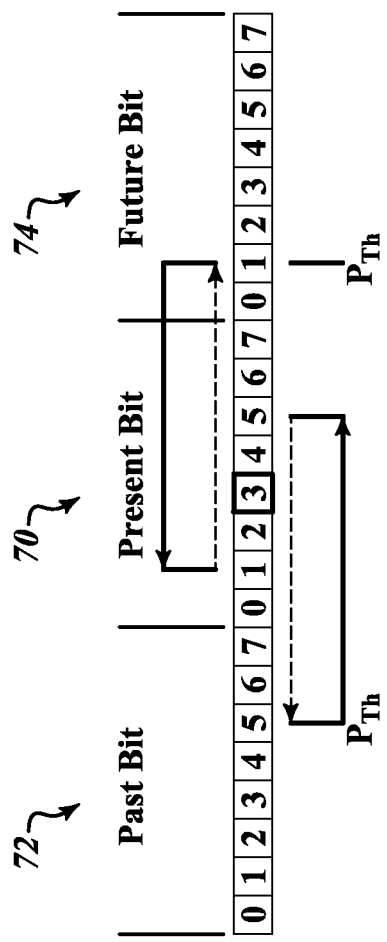
FIG. 6 is an illustration of bit recentering by a unit interval shifter of a clock and data recovery circuit according to one embodiment.

In FIG. 6 a past input data bit 72, a present input bit 70, and a future input bit 74 are represented consecutively. Each bit is divided into eight phases. The selected center sample just after lock will be the third phase of the present bit. The third phase 3 is bolded in FIG. 6 to denote that it is considered the center of the bit at the start.

If the receiver clock 40 has a slightly lower frequency than the transmitter clock, then the selected center sample will continually fall closer and closer to the past bit 72 as denoted by the dashed line below the bit positions in FIG. 6. If the selected sample is position three of the present bit after several cycles the selected sample may fall at position two of the present bit. After several more cycles the selected sample may fall at position one of the present bit then at position zero of the present bit, then it may cross into the past bit as shown in FIG. 6.

Likewise, if the receiver clock 40 has a slightly higher frequency than the transmitter clock, then the selected center sample will continually fall closer and closer to the future bit as shown by the dashed line above the bit positions in FIG. 6. If the selected sample is position three of the present bit, then after several cycles the selected sample may fall at position 4 of the present bit. After several more cycles the selected sample may fall at position 5, then position 6, then position 7, and then it may cross into the future bit.

In the example of FIG. 6, $P_{TH}$ is six phase positions away in either direction from the starting center position of the present bit. Position 3 of the present bit is regarded as the starting center position. When the selected center shifts six units in either direction (to position 5 of the past bit or to position 1 of the future bit) then the UI movement controller 66 issues a command to the frequency divider 48 to increase or decrease the division ratio by 1, as the case may be, for one clock cycle.

When the UI movement controller 66 detects that the selected center has shifted into the past bit and crossed $P_{TH}$, the UI movement controller 66 issues a command to the frequency divider 48 to decrease the division ratio for one cycle in order to increase the frequency of the divided clock signal. The frequency divider 48 therefore changes the division ratio N from 10 to 9 for one cycle and sends an acknowledgment output to the UI movement controller 66 to validate this cycle. During this cycle in which the division ratio is 9 instead of 10, the samples of 9 data bits are collected by the deserializer 66 and provided to the FIFO 50. Thus, during this cycle, new samples corresponding to 9 data bits are loaded into the FIFO. The data selector mux 62 still extracts 10 bits from the FIFO 50 in this cycle. It utilizes samples of 9 data bits provided in the divide by 9 cycle and samples of 1 bit that had accumulated in the FIFO due to movement of the center into past bit. Since the accumulated samples get utilized, the center sample can be reset back to the present bit.

When the UI movement controller 66 detects that the selected center has shifted into the future bit and crossed $P_{TH}$, the UI movement controller 66 issues a command to the frequency divider 48 to increase the division ratio for one cycle in order to decrease the frequency of the divided clock signal. The frequency divider 48 therefore changes the division ratio N from 10 to 11 for one clock cycle and sends an acknowledgment output to UI movement controller 66 to validate this cycle. During this cycle in which the division ratio is 11 instead of 10, the samples of 11 data bits are collected by the deserializer 66 and provided to the FIFO 50. Thus during this cycle, new samples corresponding to 11 data bits are loaded into the FIFO. The data selector mux 62 still extracts 10 bits from the FIFO 50 in this cycle. It utilizes samples of 10 data bits provided in the divide by 11 cycle and the remaining samples are used to restore the future bit which had been taken up due to movement of the center into the future bit. The increased samples in this cycle compensate for the movement of the center sample into the future bit and hence the center sample can be reset to the current bit.

In this way, a difference in frequency between the receiver clock 40 and the transmitter clock can be handled without the need of a large elasticity buffer (FIFO) or constraining the max burst size. Instead, a smaller FIFO and a temporary adjustment of the division ratio can be used to handle difference in frequency between the receiver clock 40 and the transmitter clock without any constraint on the maximum burst size.

Figure 7:
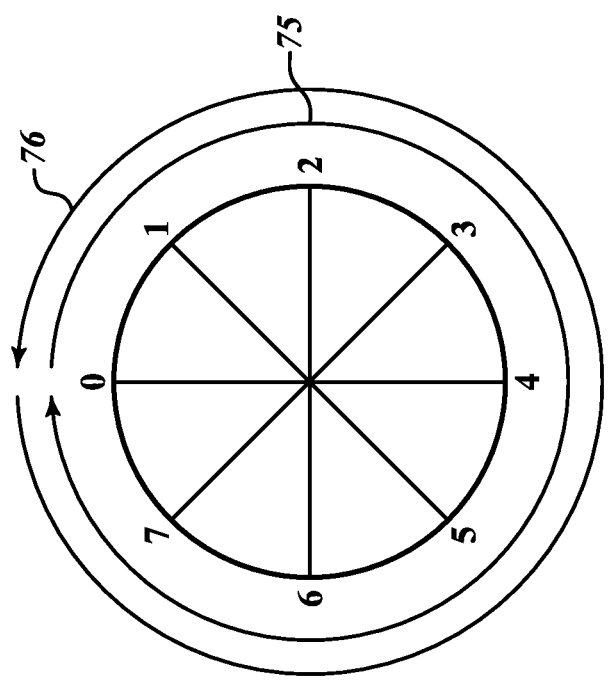
FIG. 7 is an illustration of a drifting phase difference between a generated clock signal and an input data signal.

Another way to understand the phase difference is illustrated with reference to FIG. 7. In FIG. 7 the eight phase positions of the bits received at Data In are shown to lie in a circle. Clockwise motion along the circle, as shown by the arrow 75, corresponds to the designated center sample drifting towards the future bit. Counterclockwise movement along the circle, as shown by the arrow 76, corresponds to the designated center sample drifting towards the past bit. The position of the center sample moves clockwise along the circle for the case that the frequency of the transmission clock is slower than the frequency of the receiver clock 40. When the center sample passes from position 7 to position 0 then the center sample has passed into the future bit. When the center sample passes from position 0 to position seven then the center sample has passed into the past bit. If there is continuous movement in one direction, there will be a second, a third, and further UI crossings thereby passing into future or past bits. In the known solution of FIG. 3, this crossing into multiple future or past bits was allowed to occur because the large elasticity buffer allowed for this. The CDR 32 of FIG. 4 avoids the large elasticity buffer by instead sending a command to change the division ratio for one or more cycles when the center sample has moved more than a threshold $P_{TH}$ in either direction. The frequency divider 48 executes the command and transmits an acknowledgment signal ACK to the UI movement controller 66 when the division ratio has changed. Upon receiving the acknowledgment signal ACK, the UI movement controller 66 informs the phase tracker 55, which then shifts back the center sample to the current bit.

The change in the division ratio is triggered by crossing $P_{TH}$ and not by crossing points 0 to 7 or 7 to 0. Choosing $P_{TH}$ to be several positions into the past or future bits helps to build a kind of programmable hysteresis in the system response to low amplitude high-frequency movement of the center sample. In an example in which the center sample is moved from position 3 to position 7 and will now alternate between positions 7 and 0 due to jitter, the change in division ratio will not be triggered because $P_{TH}$ has not been crossed. If however the division ratio change was to be triggered at crossings between positions 0 and 7, then shifting the center sample backward or forward by one bit (i.e., eight sample positions) would immediately trigger another shift in the opposite direction. This situation is avoided by having the thresholds further into the past and future bits respectively.

Figure 8:
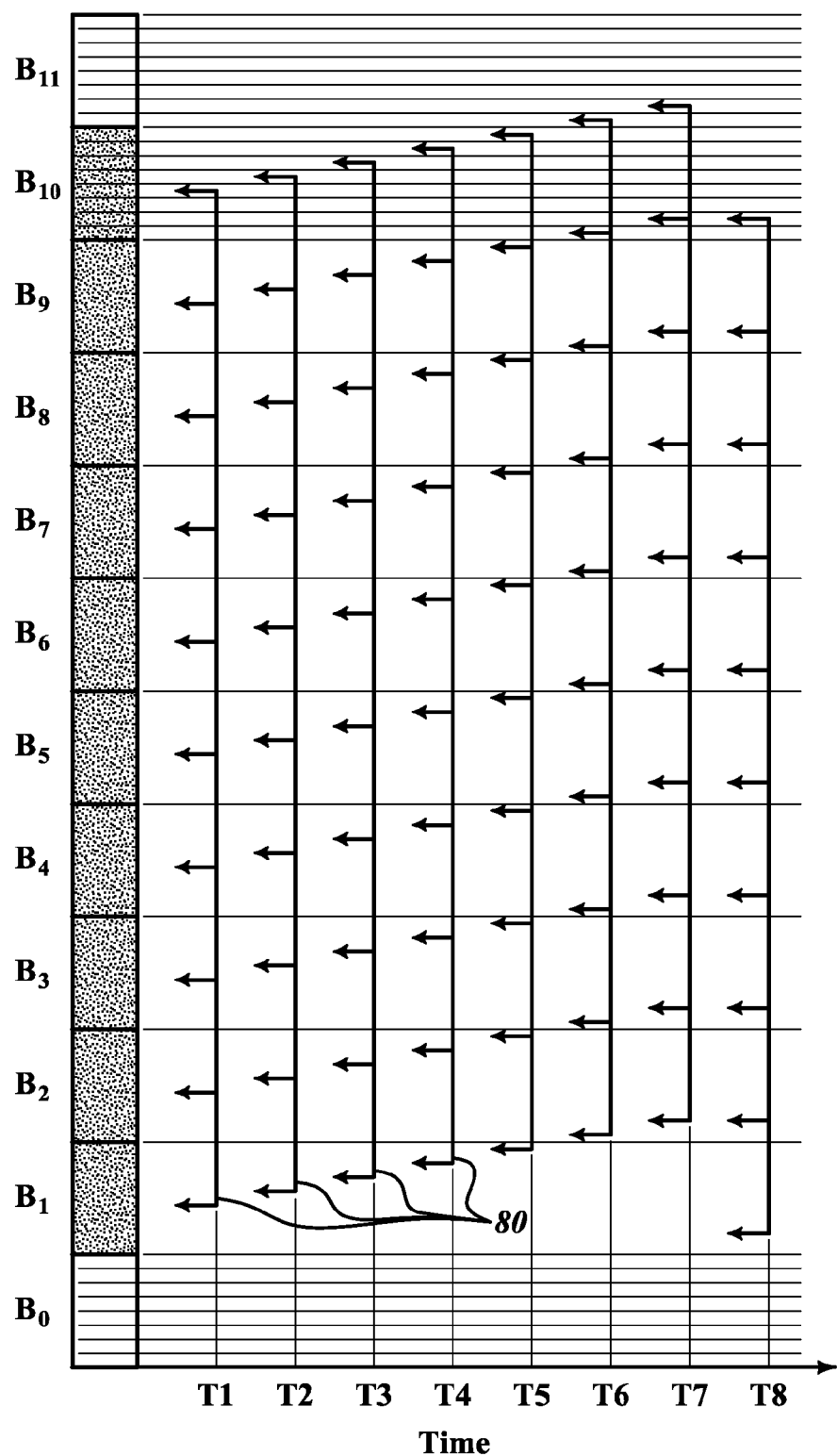
FIG. 8 is a timing diagram illustrating the drift and recentering of a clock signal according to one embodiment.
Figure 9:
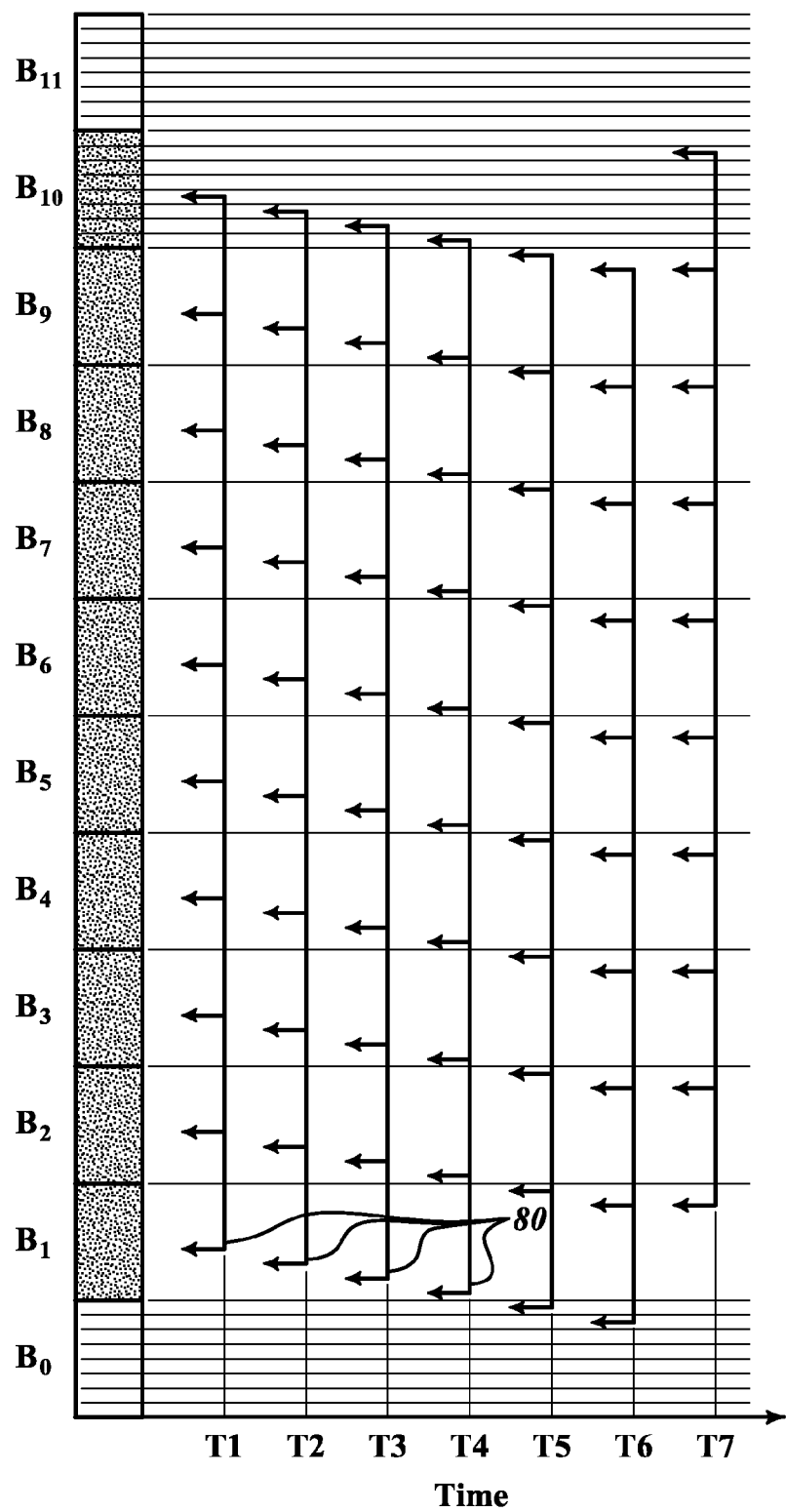
FIG. 9 is a timing diagram illustrating the drift and recentering of a clock signal according to one embodiment.

FIG. 8 and FIG. 9 are timing diagrams illustrating the example for the case of OSR=8, N=10, Frequency divider that changes its division ratio from N=10 to either 9 or 11 for one cycle and FIFO 50 being of 12 bits, i.e., 1 bit in either direction along with the N=10 current bits being processed. The FIFO 50 stores 12 data bits $B_0$-$B_{11}$ at a time, and eight oversample signals per data bit, for a total of 96 bits of storage. $B_0$ is the newest bit received by the FIFO 50 and $B_{11}$ is the oldest bit received by the FIFO 50. The stippled boxes are the current samples, i.e., the bits $B_1$-$B_{10}$ and their samples which are chosen for data extraction by default. The FIFO 50 thus includes one past $B_{11}$ and one future bit $B_0$. The 8 samples per bit are denoted by the eight horizontal lines in bits $B_0$, $B_{10}$ and $B_{11}$. The samples are shown only for bits $B_0$, $B_{10}$, and $B_{11}$ for the sake of keeping the timing diagram more easily readable, though the samples are stored for all bits $B_0$-$B_{11}$. The horizontal arrows 80 correspond to the position of the selected center sample with respect to the bits $B_0$-$B_{11}$ at times $T_1$-$T_8$.

In FIG. 8, the transmission clock 28 is faster than the clock 40 of the CDR 32. The positions of the phase signals at times $T_1$-$T_8$ illustrate that the designated selected center sample 80 is drifting. At time $T_1$ the selected center sample 80 is near the center position of each bit $B_1$-$B_{10}$. At the time $T_5$ the selected center sample 80 is on the verge of crossing into the past UI. At $T_6$, there is a UI crossing in which the selected center sample 80 has moved from position 7 of the present bit to position 0 of the past bit. Due to the built in hysteresis (as explained earlier), there is no action taken through time $T_7$. At $T_7$, $P_{TH}$ is crossed and the UI movement controller issues the command to the frequency divider 48 to decrease the division ratio to 9, thereby increasing the frequency for one clock cycle. At time $T_8$ the selected center sample 80 has been shifted back into the present bit.

FIG. 9 is a timing diagram illustrating an example in which the transmission clock 28 is slower than the clock 40 of the CDR 32. At time $T_1$ the selected center sample 80 is near the center position of each bit $B_1$-$B_{10}$. As time progresses the center sample 80 drifts toward the future bit $B_0$. At the time $T_4$ the selected center sample 80 is on the verge of crossing into the next UI. At $T_5$, there is a UI crossing in which the selected center sample 80 has moved from position 0 of the present bit to position 7 of the future bit. Due to the built in hysteresis (as explained earlier), there is no action taken through time $T_6$. At $T_6$, $P_{TH}$ has been crossed and the UI movement controller issues the command to the frequency divider 48 to increase the division ratio to N=11, thereby decreasing the frequency for one clock cycle. At time $T_7$ the selected center sample 80 has been shifted back into the present bit.

In another example the FIFO 50 stores samples of M=2 future and past bits along with current N bits. In this example, $P_{TH}$ may be chosen at 14 and P=2 and Q=1, i.e., division ratio is changed from normal value of N=10 to either 8 or 12 for one cycle only. Alternatively, P=1 and Q=2, i.e., the division ratio is changed from normal value of N=10 to either 9 or 11 for 2 cycles.

While particular examples of circuit components, division ratios, numbers of phase signals, values for $P_{TH}$, etc., have been given in the foregoing disclosure, those of skill in the art will understand that many other values and configurations of circle components can be used for a CDR 32 according to principles of the present disclosure. All such other values and circuit components and configurations fall within the scope of the present disclosure.

The various embodiments described above can be combined to provide further embodiments. All of the U.S.

patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   receiving a data signal;
   generating a first clock signal having a first frequency;
   detecting a phase shift of the data signal with respect to the first clock signal;
   outputting from a programmable frequency divider a divided clock signal having a second frequency based on the first frequency and a division ratio;
   adjusting the division ratio when the phase shift surpasses a threshold value $P_{TH}$;
   adjusting the division ratio from a base value for one or more clock cycles when the phase shift is greater than the threshold value $P_{TH}$;
   returning the division ratio to the base value; and
   decreasing the division ratio to a low value when the phase shift indicates that the first frequency is lower than a frequency of the data signal.

2. A method, comprising:
   receiving a data signal;
   generating a first clock signal having a first frequency;
   detecting a phase shift of the data signal with respect to the first clock signal;
   outputting from a programmable frequency divider a divided clock signal having a second frequency based on the first frequency and a division ratio;
   adjusting the division ratio when the phase shift surpasses a threshold value $P_{TH}$;
   adjusting the division ratio from a base value for one or more clock cycles when the phase shift is greater than the threshold value $P_{TH}$;
   returning the division ratio to the base value;
   decreasing the division ratio to a low value when the phase shift indicates that the first frequency is lower than a frequency of the data signal; and
   increasing the division ratio to a high value when the phase shift indicates that the first frequency is higher than the frequency of the data signal.

3. A method, comprising:
   receiving a data signal;
   generating a first clock signal having a first frequency;
   detecting a phase shift of the data signal with respect to the first clock signal;
   outputting from a programmable frequency divider a divided clock signal having a second frequency based on the first frequency and a division ratio;
   adjusting the division ratio when the phase shift surpasses a threshold value $P_{TH}$;
   adjusting the division ratio from a base value for one or more clock cycles when the phase shift is greater than the threshold value $P_{TH}$;
   returning the division ratio to the base value; and
   decreasing the division ratio to a low value when the phase shift indicates that the first frequency is lower than a frequency of the data signal,
   wherein the low value is equal to the base value minus 1.

4. A method, comprising:
   receiving a data signal;
   generating a first clock signal having a first frequency;
   detecting a phase shift of the data signal with respect to the first clock signal;
   outputting from a programmable frequency divider a divided clock signal having a second frequency based on the first frequency and a division ratio;
   adjusting the division ratio when the phase shift surpasses a threshold value $P_{TH}$;
   adjusting the division ratio from a base value for one or more clock cycles when the phase shift is greater than the threshold value $P_{TH}$;
   returning the division ratio to the base value;
   decreasing the division ratio to a low value when the phase shift indicates that the first frequency is lower than a frequency of the data signal; and
   increasing the division ratio to a high value when the phase shift indicates that the first frequency is higher than the frequency of the data signal,
   wherein the high value is equal to the base value plus 1.

5. The method of claim 4 wherein the threshold value $P_{TH}$ is greater than one half cycle of the first clock signal.

6. The method of claim 5 wherein the threshold value $P_{TH}$ is less than one cycle of the first clock signal.

7. A clock and data recovery circuit, comprising:
   a clock, which, in operation, generates a first clock signal having a first frequency; and
   a programmable frequency divider, which, in operation, outputs a divided clock signal having a second frequency based on the first frequency and a division ratio, and adjusts the division ratio when a phase shift of a received data signal with respect to the first clock signal surpasses a threshold value $P_{TH}$,
   wherein the programmable frequency divider, in operation, adjusts the division ratio from a base value for one or more clock cycles when the phase shift is greater than the threshold value $P_{TH}$, and returns the division ratio to the base value, and
   wherein the programmable frequency divider, in operation, decreases the division ratio to a low value when the phase shift indicates that the first frequency is lower than a frequency of the data signal.

8. The clock and data recovery circuit of claim 7 wherein the programmable frequency divider, in operation, increases the division ratio to a high value when the phase shift indicates that the first frequency is higher than the frequency of the data signal.

9. The clock and data recovery circuit of claim 8 wherein the high value is equal to the base value plus 1.

10. The clock and data recovery circuit of claim 7 wherein the low value is equal to the base value minus 1.

11. The clock and data recovery circuit of claim 7 wherein the threshold value $P_{TH}$ is greater than one half cycle of the first clock signal.

12. The clock and data recovery circuit of claim 11 wherein the threshold value $P_{TH}$ is less than one cycle of the first clock signal.

13. A clock and data recovery circuit, comprising:
   reception means for receiving a data signal;
   clock means for generating a first clock signal having a first frequency;

detection means for detecting a phase shift of the data signal with respect to the first clock signal; and frequency dividing means for outputting a divided clock signal having a second frequency based on the first frequency and a division ratio, and adjusts the division ratio when the phase shift surpasses a threshold value $P_{TH}$, wherein the frequency dividing means adjusts the division ratio from a base value for one or more clock cycles when the phase shift is greater than the threshold value $P_{TH}$, and returns the division ratio to the base value, and wherein the frequency dividing means decreases the division ratio to a low value when the phase shift indicates that the first frequency is lower than a frequency of the data signal, the low value being equal to the base value minus 1, and increases the division ratio to a high value when the phase shift indicates that the first frequency is higher than the frequency of the data signal, the high value being equal to the base value plus 1.

14. The clock and data recovery circuit of claim 13 wherein the threshold value $P_{TH}$ is greater than one half cycle of the first clock signal.

\* \* \* \* \*